United States Patent
Inanami et al.

(10) Patent No.: US 8,647,106 B2
(45) Date of Patent: Feb. 11, 2014

(54) TEMPLATE AND METHOD OF MANUFACTURING A SEMICONDUCTOR DEVICE

(75) Inventors: Ryoichi Inanami, Kanagawa (JP); Shinji Mikami, Kanagawa (JP); Takuya Kono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 348 days.

(21) Appl. No.: 12/727,038

(22) Filed: Mar. 18, 2010

(65) Prior Publication Data

US 2010/0252188 A1      Oct. 7, 2010

(30) Foreign Application Priority Data

Apr. 1, 2009   (JP) .................................. 2009-88884

(51) Int. Cl.
*B32B 38/00*           (2006.01)
(52) U.S. Cl.
USPC .......................................... 425/385; 264/293
(58) Field of Classification Search
USPC .......................................... 264/293; 425/385
See application file for complete search history.

(56) References Cited

U.S. PATENT DOCUMENTS

| | | | |
|---|---|---|---|
| 6,916,584 B2 | 7/2005 | Sreenivasan et al. | |
| 7,371,975 B2 * | 5/2008 | Dory et al. ................... | 174/262 |
| 7,510,388 B2 | 3/2009 | Terasaki et al. | |
| 7,690,910 B2 | 4/2010 | Nakamura et al. | |
| 7,878,791 B2 | 2/2011 | Simon et al. | |
| 7,981,304 B2 | 7/2011 | Terasaki et al. | |
| 8,011,915 B2 | 9/2011 | Simon | |
| 2007/0102838 A1 | 5/2007 | Simon | |
| 2007/0102844 A1 | 5/2007 | Simon et al. | |
| 2007/0176320 A1 * | 8/2007 | Nakamura et al. ............ | 264/219 |
| 2007/0187875 A1 | 8/2007 | Terasaki et al. | |
| 2007/0247608 A1 * | 10/2007 | Sreenivasan et al. ........... | 355/75 |
| 2008/0090170 A1 | 4/2008 | Yoneda | |
| 2009/0152239 A1 | 6/2009 | Terasaki et al. | |
| 2009/0152753 A1 | 6/2009 | Terasaki et al. | |
| 2009/0305152 A1 | 12/2009 | Inanami et al. | |
| 2011/0278259 A1 | 11/2011 | Terasaki et al. | |
| 2011/0283937 A1 | 11/2011 | Simon | |

FOREIGN PATENT DOCUMENTS

| | | |
|---|---|---|
| JP | 2007-103915 | 4/2007 |
| JP | 2007-182063 | 7/2007 |
| JP | 2007-230229 | 9/2007 |
| JP | 2008-091782 | 4/2008 |

OTHER PUBLICATIONS

Notification of Reason for Rejection issued by the Japanese Patent Office on Aug. 27, 2013, for Japanese Patent Application No. 2009-088884, and English-language translation thereof, (4 pages).

* cited by examiner

*Primary Examiner* — Amjad Abraham
(74) *Attorney, Agent, or Firm* — Finnegan, Henderson, Farabow, Garrett & Dunner, L.L.P.

(57) ABSTRACT

A template formed of an optically-transparent material according to an embodiment includes a contact surface which contacts a resist material, a concave portion for resist pattern formed on the contact surface in which the resist material is filled and cured so as to form a resist pattern part, and a concave portion for alignment mark formed on the contact surface which is used for an optical alignment of the template, includes an opening and a bottom portion and has a shape that an area of the opening is larger than that of the bottom portion or a shape that a depth thereof is deeper than that of the concave portion for resist pattern.

12 Claims, 7 Drawing Sheets

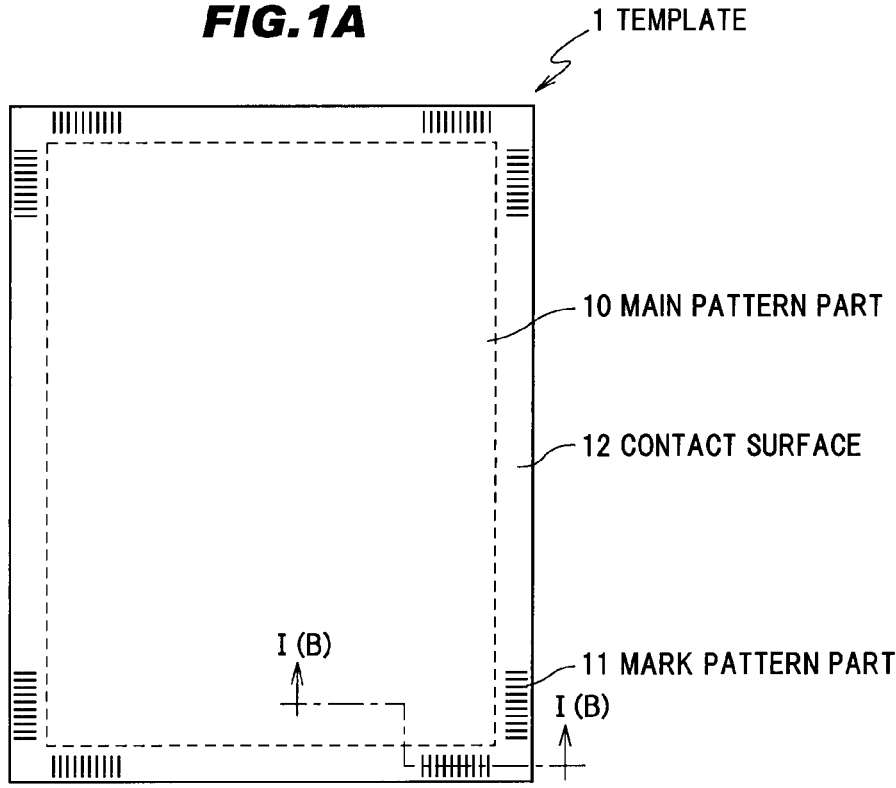
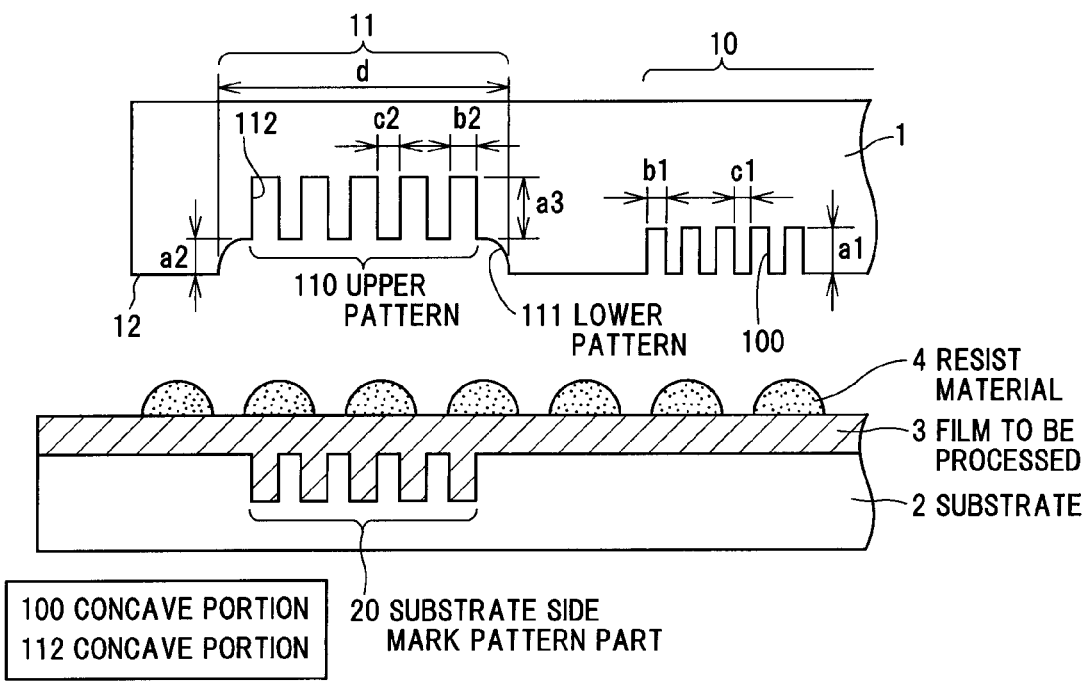

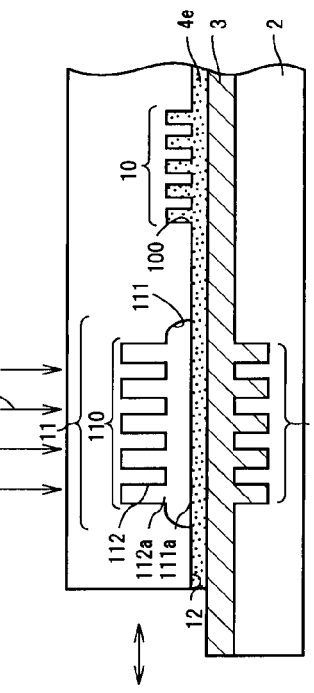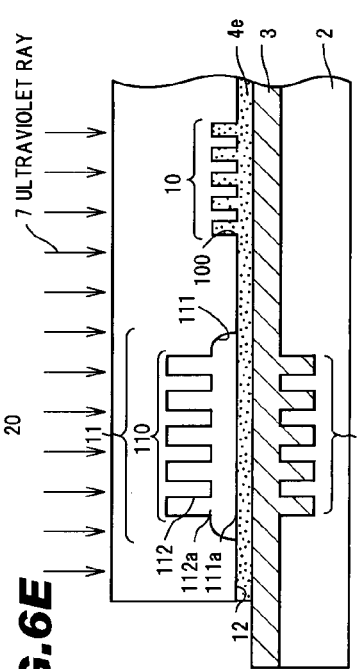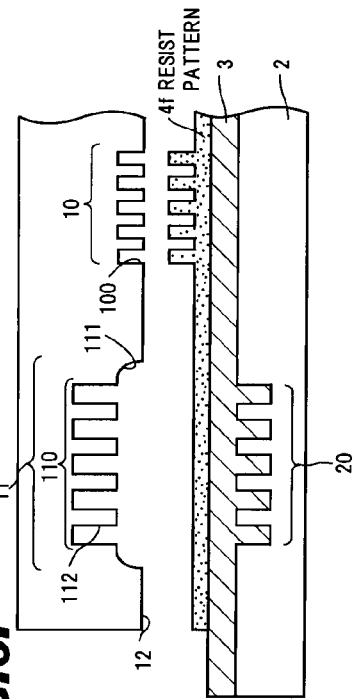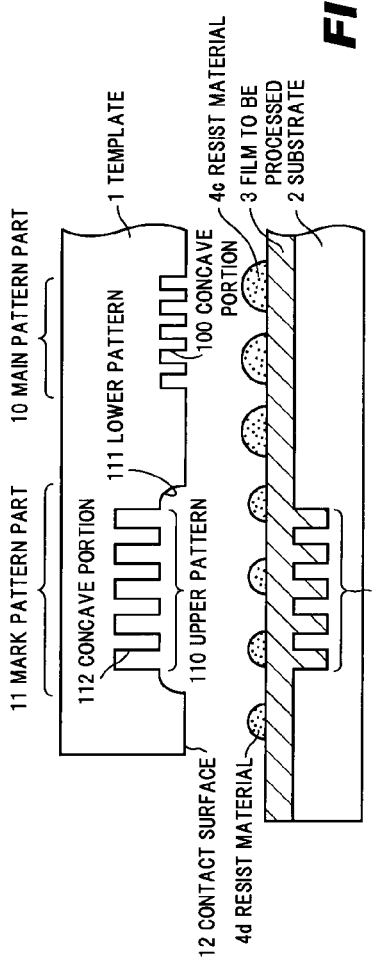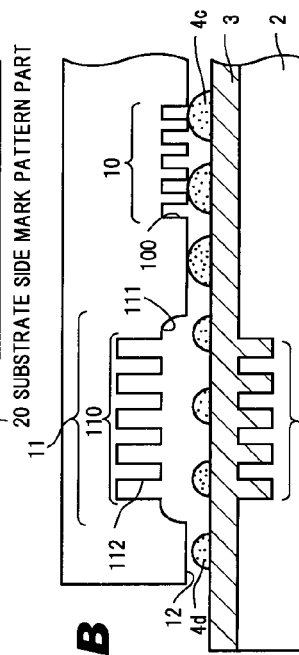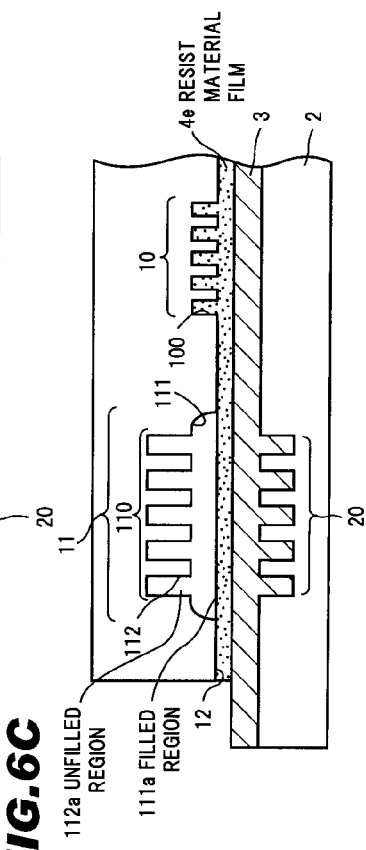

TEMPLATE AND METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2009-088884, filed on Apr. 1, 2009 the entire contents of which are incorporated herein by reference.

BACKGROUND

As a conventional technique, an alignment method for imprint lithography is known, in which an alignment process is carried out by using alignment marks respectively formed on a template for imprint and a substrate (U.S. Pat. No. 6,916,584).

In the template, a pattern region for forming a pattern to be a mask on a substrate is formed, and a groove for preventing the alignment marks from being filled in a resist material is formed between the pattern region and the alignment marks, because the alignment marks immerged in the resist material cannot be distinguished from the pattern region. Consequently, at the time of transferring the template pattern, the resist is absorbed in the groove of the template so that a substrate region exists that is not covered with the resist. After that, for example, when the substrate is etched by using the resist pattern as a mask, a pattern having a desired size may not be obtained due to an influence of the density of resist pattern.

Also, as the other conventional technique, a method is known that an imprint process is carried out by that a resist is also coated on a mark pattern formation region of a substrate. In the method, an imprint mold is used, that comprises a first pattern region configured by a plurality of first concave portions, and a second pattern region configured by a plurality of second concave portions for being used as an alignment mark. And, the first pattern region and the second pattern region have an equal height at their outermost surfaces, the first concave portions and the second concave portions have different depths each other, and the first pattern region and the second pattern region mutually have an equal cyclic interval.

However, when a resist pattern is formed by using the imprint mold, an alignment to patterns and marks of lower layers which have been already formed is needed, but the resist is filled in the whole of the pattern of the alignment part of the template, so that a high-accuracy alignment may not be carried out.

BRIEF SUMMARY

A template formed of an optically-transparent material according to an embodiment includes a contact surface which contacts a resist material, a concave portion for resist pattern formed on the contact surface in which the resist material is filled and cured so as to form a resist pattern part, and a concave portion for alignment mark formed on the contact surface which is used for an optical alignment of the template, includes an opening and a bottom portion and has a shape that an area of the opening is larger than that of the bottom portion or a shape that a depth thereof is deeper than that of the concave portion for resist pattern.

A template formed of an optically-transparent material according to the other embodiment includes a contact surface which contacts a resist material, a concave portion for resist pattern formed on the contact surface in which the resist material is filled and cured so as to form a resist pattern part, and a concave portion for alignment mark formed on the contact surface which is used for an optical alignment of the template, includes a first concave portion having a first width size and formed in a bottom side and a second concave portion having a second width size larger than the first width size and formed in an opening side so as to be connected with the first concave portion.

A method of manufacturing a semiconductor device according to the other embodiment comprises bringing a template including a concave portion for resist pattern and a concave portion for alignment mark into contact with a resist material disposed on the member to be processed, filling the concave portion with the resist material so that a filled region and an unfilled region are formed in the concave portion for alignment mark, and aligning the template to the member to be processed by relative movement of the template and the member to be processed.

BRIEF DESCRIPTION OF THE DRAWING

FIG. 1A is a plan view schematically showing a contact surface used in a template according to a first embodiment of the invention;

FIG. 1B is a cross-sectional view schematically showing the primary portion of a substrate and a template set in a processing device;

FIGS. 6A to 6F are cross-sectional views schematically and respectively showing the primary portion of processes of a method of manufacturing a semiconductor device according to a third embodiment.

DETAILED DESCRIPTION

[First Embodiment]

Figure 2A:
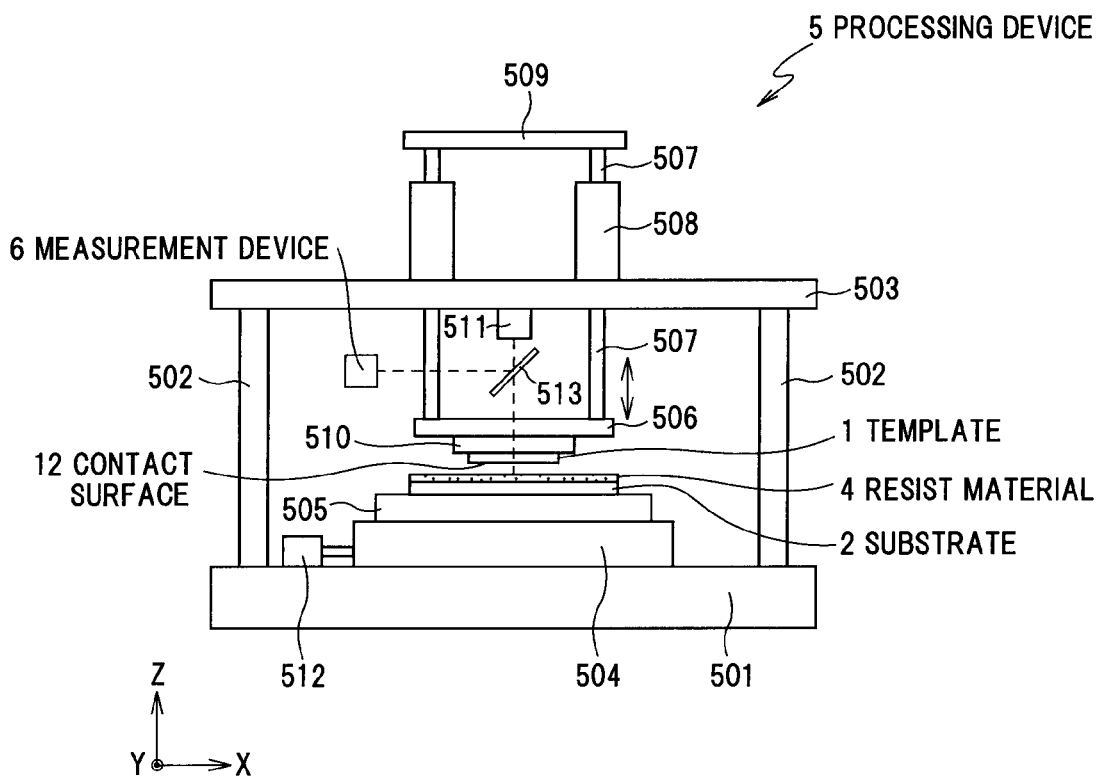
FIG. 2A is an explanatory view schematically showing the processing device.

FIG. 1A is a plan view schematically showing a contact surface of a template according to a first embodiment of the invention. FIG. 1B is a cross-sectional view taken along the line I(B)-I(B) in FIG. 1A and schematically showing a cross-section of a substrate and the template.

As shown in FIGS. 1A and 1B, the template 1 as a template for imprinting roughly includes a contact surface for contacting a resist material 4, a main pattern part 10 as a concave portion for resist patterning formed on the contact surface 12 which forms a mask pattern part after the resist material 4 is filled therein and cured, and a mark pattern part 11 as a concave portion for alignment mark formed on the contact surface 12 which is used for an optical alignment of the template 1.

The template 1 is formed of a material having an optically-transparent property to ultraviolet light such as quartz material.

The main pattern part 10 is used as, for example, a mold of mask pattern used for forming a circuit pattern of a semiconductor device or the like, and as shown in FIG. 1B, is configured so as to include a plurality of concave portions 100 which have a depth a1 of 20 to 100 nm and a width b1 of 10 to 50 nm, and are arranged at an interval c1 of 10 to 50 nm equal to the width b1. In the embodiment, the depth a1 is set to 50 nm, and the width b1 and the interval c1 are respectively set to 20 nm.

A plurality of the mark pattern parts 11 are formed, for example, at the periphery of the main pattern part 10. Also, as shown in FIG. 1B, for example, the mark pattern part 11 has a structure that a plurality of concave portions different in shape from each other are incorporated in the direction of the thickness of template 1, and it roughly includes an upper pattern 110 having a plurality of concave portions 112 as a first concave portion b2 having a first width size of 0.8 to 1.2 μm and formed in a bottom side when the contact surface 12 is faced up, and a lower pattern 111 having a second width size d of 1.5 to 15 μm larger than the first width size b2 and formed in an opening side so as to be connected with the upper pattern 110 in the direction of substrate flat surface. The mark pattern part 11 forms a pattern, for example, that a plurality of concave parts are disposed at equal intervals in case of seeing it from the side of contact surface 12. In the embodiment, the first concave portion b2 is set to 1 μm and the second width size d is set to 12 μm.

The concave portion 112 of the upper pattern 110 is formed, as shown in FIG. 1B, for example, so as to have a structure that a depth a3 from an upper portion of the lower pattern 111 is 20 to 100 nm and an interval c2 is 0.8 to 1.2 μm that is almost equal to the first width size b2. In the embodiment, the depth a3 is set to 50 nm and the interval c2 is set to 1 μm.

The lower pattern 111 is formed, as shown in FIG. 1B, for example, so as to have a structure that a depth a2 from the contact surface 12 is 20 to 100 nm. In the embodiment, the depth a2 from the contact surface 12 is equal to the depth a1 of the concave portion 100 of the main pattern part and the depth a2 is set to 50 nm.

The substrate 2 is formed of, for example, a silicon based material in which a plurality of substrate side mark pattern parts 20 are formed. The substrate side mark pattern part 20 has a width and an interval of the concave portion, for example, almost equal to those of the concave portion 112 of the upper pattern 110.

The film to be processed 3 as a material to be processed is formed of, for example, a silicon nitride, a silicon oxide, a metal material or the like, and it is formed of a single film or a plurality of films. Further, the material to be processed is not limited to the film to be processed 3, but the substrate 2 can be also used.

The resist material 4 is, for example, ultraviolet light-curable resist and it is formed of an ultraviolet light-curable resin capable of being hardened by irradiation of ultraviolet light. Further, the resist material 4 is not limited to the ultraviolet light-curable resist, but for example, a material can be used if it is capable of being hardened by that hardening treatment is carried out in a condition that it is filled in the template 1, such as a material capable of being hardened by irradiation of an energy light other than ultraviolet light, a material capable of being hardened by the application of heat and a material capable of being hardened by both of the irradiation of the energy light and subsequent application of heat.

Figure 2B:
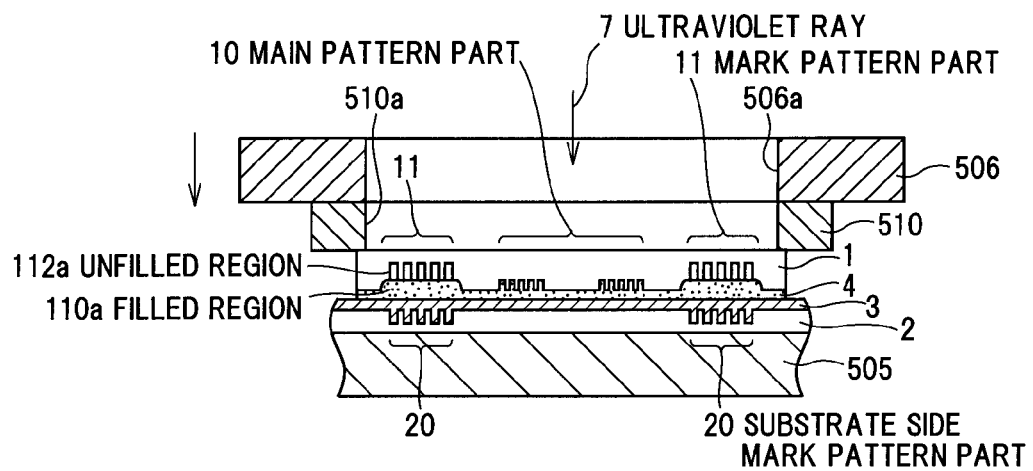
FIG. 2B is a cross-sectional view schematically showing the primary portion of the processing device during processing.

FIG. 2A is an explanatory view schematically showing the processing device. FIG. 2B is a cross-sectional view schematically showing the primary portion of the processing device during processing. FIG. 2A shows the whole of the processing device before processing and FIG. 2B shows the primary portion of the processing device during processing. Further, in FIG. 2A, X, Y and Z show directions perpendicular to each other.

As shown in FIG. 2A, the processing device 5 has a structure that a base plate 501 and a top board 503 are combined via support rods 502. An XY stage 504 is disposed on the base plate 501 and a chuck 505 for fixing the substrate 2 by electrostatic chuck, vacuum chuck or the like is disposed on the XY stage 504.

A plurality of actuators 508 for allowing an upper stage 506 to moves up and down via a plurality of guide bars 507 are installed on the top board 503. The upper edges of the guide bars 507 are combined via a guide plate 509. The XY stage 504 allows the chuck 505 and the substrate 2 to move in the X and Y directions.

A template chuck 510 for fixing the template 1 by electrostatic chuck, vacuum chuck or the like is installed on the upper stage 506. Also, an irradiation part 511 for irradiating ultraviolet light 7 to the resist material 4 formed on the substrate 2 via a half mirror 513, the upper stage 506, the template chuck 510 and the template 1 is disposed on the lower surface of top board 503. As shown in FIG. 2B, openings 506a, 510a for transmitting the ultraviolet light 7 irradiated from the irradiation part 511 are formed in the upper stage 506 and the template chuck 510.

Also, the irradiation part 511 emits an alignment light described below used for an optical alignment of the main pattern part 10 other than the ultraviolet light 7. The alignment light is, for example, a light included in a region of visible light.

An actuator 512 is installed in the XY stage 504 and it allows the XY stage 504 to move in the X and Y directions at the time of optical alignment between the template 1 and the substrate 2.

Further, the rear surface of the template 1 can be pushed to a side of substrate 2 via fluid (liquid or gas). Due to this, an influence of flatness of the rear surface of the template 1 can be reduced.

Also, the processing device 5 has the half mirror 513 at the position between the irradiation part 511 and the upper stage 506. The half mirror 513 leads the alignment light reflected from the substrate 2, the film to be processed 3, the resist material 4 and the template 1 to a measurement device 6. The measurement device 6 measures, for example, interference fringes formed by the alignment light that enters into the measurement device 6.

As shown FIG. 2B, the mark pattern part 11 has a shape that an area of the opening formed on the contact surface 12 by the lower pattern 111 is larger than that of the bottom portion of the concave portion 112 of the upper pattern 110 or a shape that a depth thereof is deeper than that of the main pattern part 10 so that an unfilled region 112a can be formed when the main pattern part 10 is filled with the resist material 4.

Hereinafter, an example of a method of manufacturing a template according to the embodiment will be explained.
(Method of Manufacturing Template)

FIGS. 3A to 3D are cross-sectional views schematically and respectively showing the primary portion of manufacturing processes of the template according to the first embodiment.

Figure 3A:
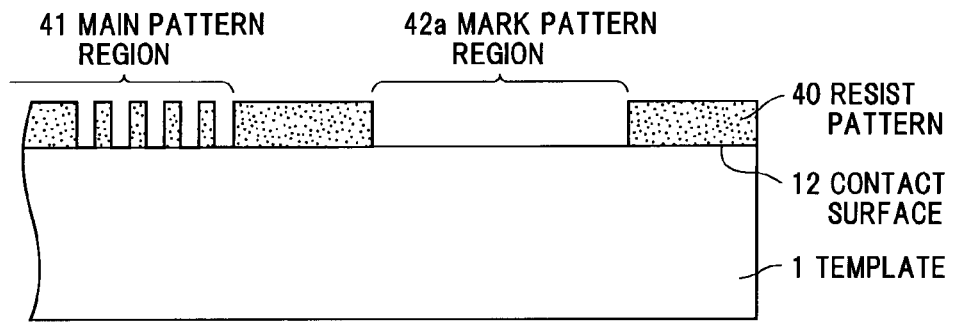
FIGS. 3A to 3D are cross-sectional views schematically and respectively showing the primary portion of manufacturing processes of the template according to the first embodiment.

First, as shown in FIG. 3A, a resist material is coated on the contact surface 12 of the template 1, and a resist pattern 40 is formed by a lithography method that has a main pattern region 41 for forming the main pattern part 10 and a mark pattern region 42a for forming the lower pattern 111.

Figure 3B:
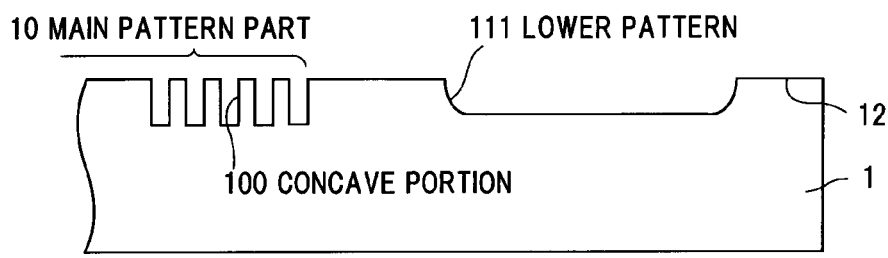

Next, as shown in FIG. 3B, the main pattern part 10 and the lower pattern 111 are formed by an etching process due to Reactive Ion Etching (RIE) method or the like while the resist pattern 40 is used as a mask, and the resist pattern 40 is removed.

Figure 3C:
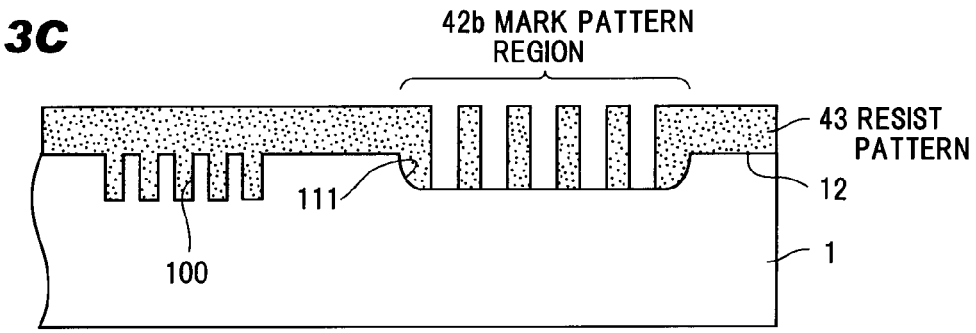

Next, as shown in FIG. 3C, a resist material is coated on the template 1, and a resist pattern 43 is formed by the lithography method that has a mark pattern region 42b for forming the upper pattern 110 in the lower pattern 111.

Figure 3D:
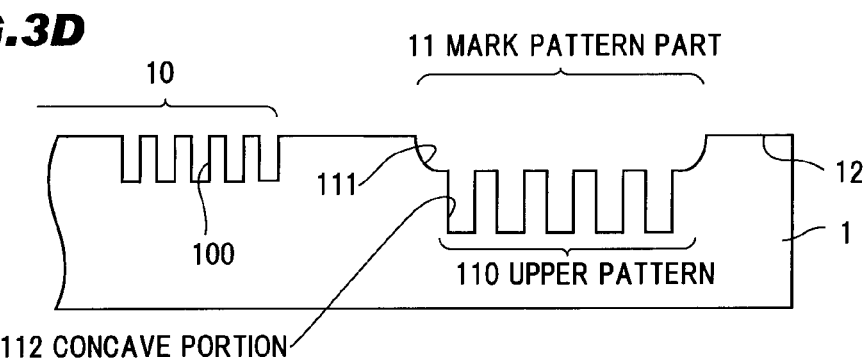

Next, as shown in FIG. 3D, the upper pattern 110 is formed by the etching process due to RIE method or the like while the resist pattern 43 is used as a mask, and the resist pattern 43 is removed so as to obtain the template 1 in which the main pattern part 10 and the mark pattern part 11 are formed on the contact surface 12.

Hereinafter, an example of a method of manufacturing a semiconductor device according to the embodiment will be explained.

(Manufacturing Method of Semiconductor Device)

FIGS. 4A to 4F are cross-sectional views schematically and respectively showing the primary portion of processes of a method of manufacturing a semiconductor device according to the first embodiment.

First, the resist material 4 having, for example, a shape of droplets is disposed on the film to be processed 3 formed on the substrate 2 fixed to the chuck 505. The resist material 4 is disposed on the film to be processed 3, for example, so that each of the droplets has an equal amount to each other.

Figure 4A:
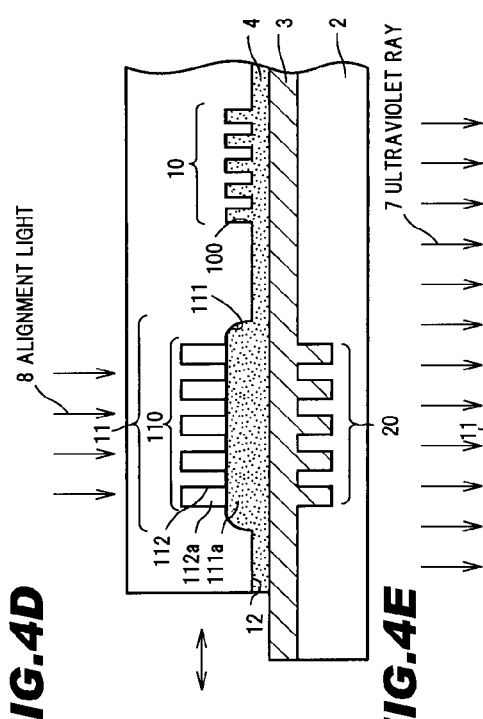
FIGS. 4A to 4F are cross-sectional views schematically and respectively showing the primary portion of processes of a method of manufacturing a semiconductor device according to the first embodiment.

Next, the template 1 is fixed to a template chuck 510 of the processing device 5 so that the contact surface 12 of the template 1 in which the main pattern part 10 and the mark pattern part 11 are formed is faced to a side of the XY stage 504. Subsequently, as shown in FIG. 4A, the contact surface 12 of the template 1 and the substrate 2 are arranged to be opposed each other.

Figure 4B:
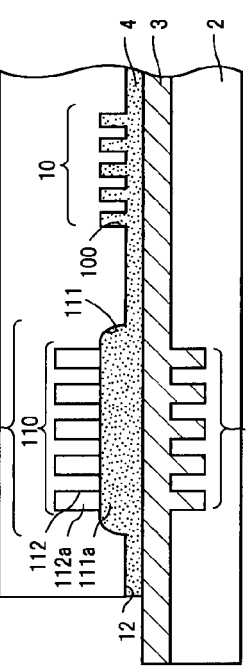
Figure 4C:
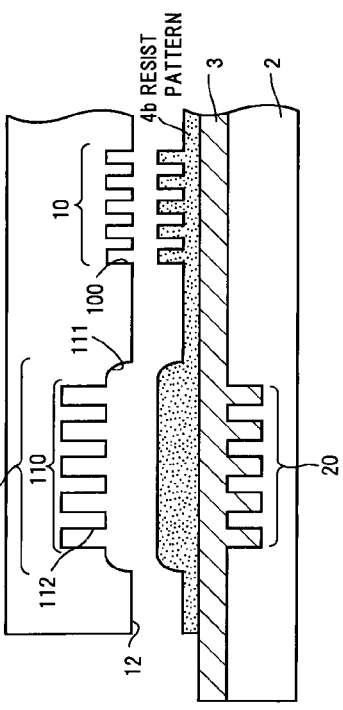

Next, as shown in FIG. 4B, the upper stage 506 is lowered by the actuator 508 and the template 1 is pushed to the resist material 4 having a shape of droplets. As shown in FIG. 4C, after a while, the resist material 4 is mainly filled in the concave portion 100 of the main pattern part 10 and the lower pattern 111 of the mark pattern part 11 due to capillarity. Further, it can be also adopted that the template 1 is brought into contact with the resist material 4 instead of being pushed to the resist material 4, depending on the condition of the resist material 4 before curing.

At this time, in the mark pattern part 11, a filled region 111a in which the resist material 4 is filled and an unfilled region 112a in which the resist material 4 is not filled are formed. Also, a resist material film 4a is formed between the template 1 and the substrate 2 by the resist material 4 filled in the lower pattern 111 and the concave portions 100.

Figure 4D:
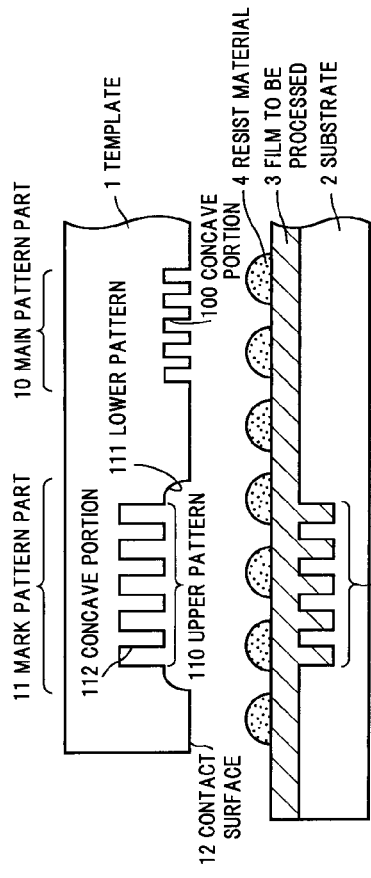

Next, as shown in FIG. 4D, an alignment light 8 is irradiated from the irradiation part 511 to the substrate 2 via the upper stage 506, the template chuck 510 and the template 1 so that an alignment between the template 1 and the substrate 2 is carried out.

Particularly, for example, the alignment light 8 is irradiated, interference fringes formed by the alignment light 8 mainly reflected at the mark pattern part 11 of the template 1 and the substrate side mark pattern part 20 are measured by the measurement device 6, the XY stage is moved by driving the actuator 512 so that the interference fringes are arranged at equal intervals, and a position of the substrate 2 is adjusted. Further, the alignment between the template 1 and the substrate 2 can be carried out by moving the template 1, and the adjustment of the position of the substrate 2 can be also carried out, for example, by inclining the template 1 or the substrate 2, or deforming the template 1 or the substrate 2 by applying a pressure to the template 1 or the substrate 2.

Figure 4E:
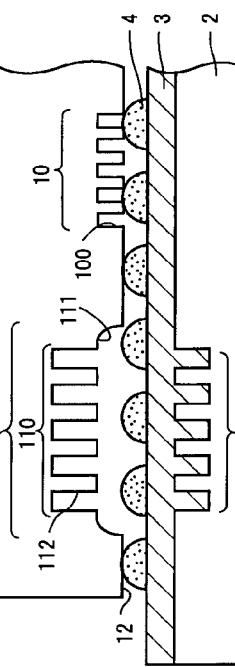

Next, as shown in FIG. 4E, after the alignment between the template 1 and the substrate 2 has been completed, an ultraviolet light 7 is irradiated from the irradiation part 511 to the resist material film 4a via the half mirror 513, the upper stage 506, the template chuck 510 and the template 1.

Figure 4F:
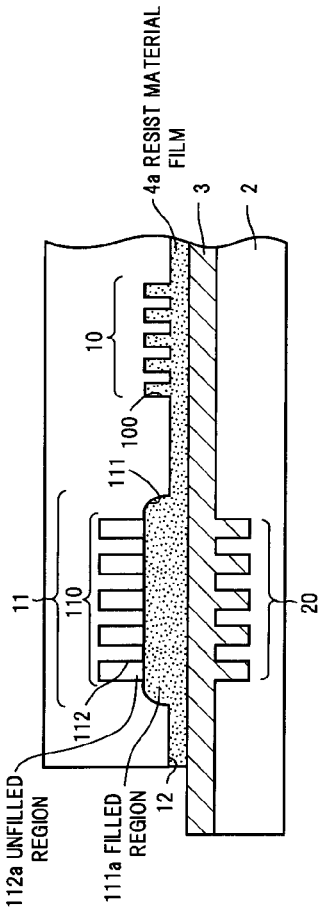

Next, as shown in FIG. 4F, after the resist material film 4a has been cured, when the upper stage 506 is elevated by driving the actuator 508, a resist pattern 4b in which the main pattern part 10, the mark pattern part 11 and the like formed in the template 1 are transferred is formed on the film to be processed 3. The resist pattern 4b is also formed on the substrate side mark pattern part 20, so that dimension accuracy of the patterns formed after the processing treatment can be enhanced in comparison with the resist pattern 4b is not formed on the substrate side mark pattern part 20, and the main pattern part 10 can be formed so as to have a region larger in size.

Subsequently, a process that after the resist pattern 4b is etched back so as to expose a part of the film to be processed 3, an etching is carried out by using the remaining resist pattern as a mask, and the like are passed through so that a desired semiconductor device is obtained.

(Advantages of First Embodiment)

According to a template for imprinting and a method of manufacturing a semiconductor device of the first embodiment, the following advantages can be obtained. An unfilled region 112a is formed on the mark pattern part 11 of the template 1 at the time of the alignment to the patterns and the like which have been already formed, so that a difference in refraction index to the alignment light is caused, and the measurement of the alignment can be easily carried out, consequently, alignment accuracy can be enhanced. Further, it is not needed that a groove or the like for preventing the resist material from being filled in the mark pattern part is formed on the template, degree of freedom of layouts of the main pattern part 10 and the mark pattern part 11 can be enhanced, and the number of the semiconductor chips to be manufactured from one substrate is increased, so that productivity can be enhanced. Further, in addition to this, a resist is also formed on the substrate side mark pattern part 20, so that dimension accuracy of the patterns formed after the processing treatment can be enhanced in comparison with the resist is not formed on the substrate side mark pattern part 20, and the main pattern part 10 can be formed so as to have a region larger in size. Since the alignment accuracy and dimension accuracy the patterns formed after the processing treatment are enhanced, yield ratio of the semiconductor device to be manufactured can be enhanced, and further, performance of the semiconductor device to be manufactured can be also enhanced.

[Second Embodiment]

A second embodiment differs in a manufacturing method of the template from the first embodiment. Further, in the following embodiments, with regard to components having the same construction and function as the first embodiment, the same references as the first embodiment are used, and detail explanation is omitted.

Hereinafter, an example of a method of manufacturing a template according to the embodiment will be explained.

(Manufacturing Method of Template)

FIGS. 5A to 5D are cross-sectional views schematically and respectively showing the primary portion of manufacturing processes of the template according to a second embodiment.

Figure 5A:
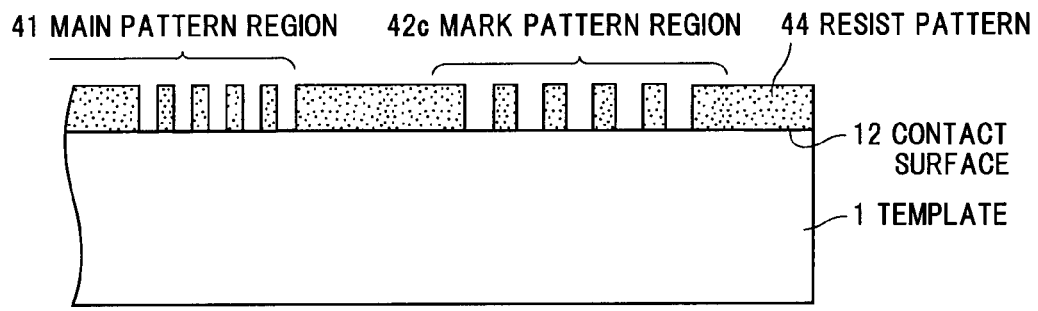
FIGS. 5A to 5D are cross-sectional views schematically and respectively showing the primary portion of manufacturing processes of the template according to a second embodiment.

First, as shown in FIG. 5A, a resist material is coated on the contact surface 12 of the template 1, and a resist pattern 44 is formed by a lithography method that has a main pattern region 41 for forming the main pattern part 10 and a mark pattern region 42c for forming the concave portion 113 to become the upper pattern 110.

Figure 5B:
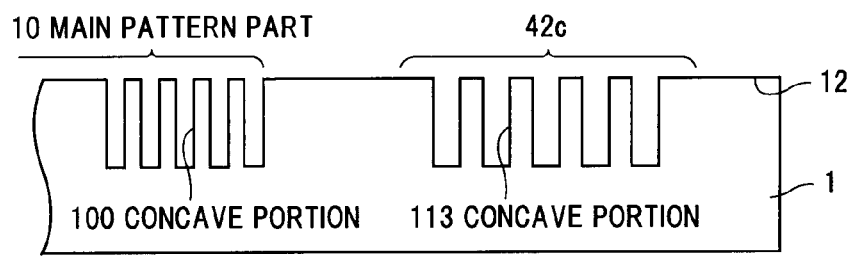

Next, as shown in FIG. 5B, concave portions 100 in the main pattern part 10 and concave portions 113 in the mark pattern region 42c are formed by an etching process due to RIE method or the like while the resist pattern 44 is used as a mask, and the resist pattern 44 is removed. The concave portion 100 in the main pattern part 10 and the concave portion 113 in the mark pattern region 42c have an equal depth from the contact surface 12 to each other.

Figure 5C:
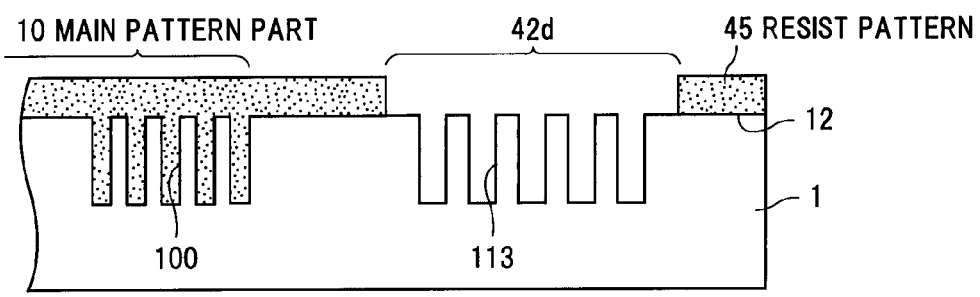

Next, as shown in FIG. 5C, a resist material is coated on the template 1, and a resist pattern 45 is formed by the lithography method that has a mark pattern region 42d for forming the lower pattern 111.

Figure 5D:
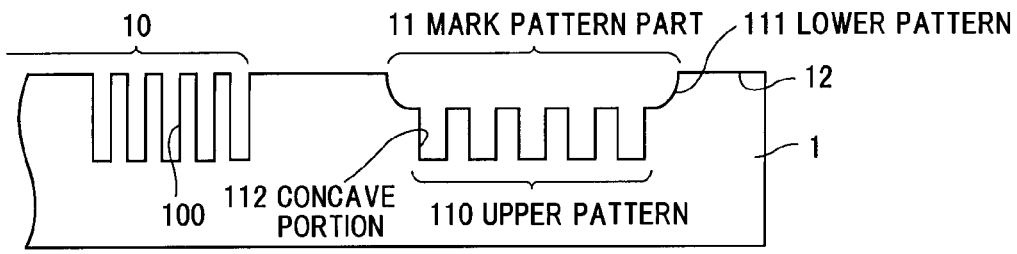

Next, as shown in FIG. 5D, the lower pattern 111 is formed by the etching process due to RIE method or the like while the resist pattern 45 is used as a mask, and the resist pattern 45 is removed so as to obtain the template 1 in which the main pattern part 10 and the mark pattern part 11 are formed on the contact surface 12.

(Advantages of Second Embodiment)

According to a template of the second embodiment, the main pattern part 10 and a part to become the upper pattern part 110 used at the alignment are simultaneously formed, so that misalignment between the main pattern part 10 and the mark pattern part 11 can be prevented in comparison with a case that the main pattern part 10 and the lower pattern part 111 are simultaneously formed, and the alignment accuracy between the template 1 and the substrate 2 can be enhanced, and consequently, yield rate and performance of the semiconductor device can be enhanced.

[Third embodiment]

A third embodiment differs from the above-mentioned embodiments in that an amount of the resist material to be disposed differs in two regions on the substrate corresponding to the main pattern part and the mark pattern part.

Hereinafter, an example of a method of manufacturing a semiconductor device according to the embodiment will be explained.

(Manufacturing Method of Semiconductor Device)

FIGS. 6A to 6F are cross-sectional views schematically and respectively showing the primary portion of processes of a method of manufacturing a semiconductor device according to a third embodiment.

First, the resist materials 4c and 4d having, for example, a shape of droplets is disposed on the film to be processed 3 formed on the substrate 2 fixed to the chuck 505. Here, the resist material 4c disposed in a first amount has an amount per one droplet larger than the resist material 4d, and it is disposed on the film to be processed 3 corresponding to the main pattern part 10 as a first region. Also, the resist material 4d disposed in a second amount has an amount per one droplet smaller than the resist material 4c, and it is disposed on the film to be processed 3 corresponding to the mark pattern part 11 as a second region. Further, it can be also adopted that the amount per one droplet is equalized and intervals or the like to be arranged on the film to be processed 3 corresponding to the main pattern part 10 and the mark pattern part 11 are adjusted, so that the amounts of the resist materials are adjusted.

Next, the template 1 is fixed to a template chuck 510 of the processing device 5 so that the contact surface 12 of the template 1 in which the main pattern part 10 and the mark pattern part 11 are formed is faced to a side of the XY stage 504. Subsequently, as shown in FIG. 6A, the contact surface 12 of the template 1 and the substrate 2 are arranged to be opposed each other.

Next, as shown in FIG. 6B, the upper stage 506 is lowered by the actuator 508 and the template 1 is pushed to the resist materials 4c and 4d having a shape of droplets. As shown in FIG. 6C, by that the template 1 is pushed to the resist materials 4c and 4d, the resist material 4c is mainly filled in the concave portion 100 of the main pattern part 10.

Here, when the main pattern part 10 is filled with the resist material 4c, an unfilled region 112a is formed in the mark pattern part 11.

Next, as shown in FIG. 6D, an alignment light 8 is irradiated from the irradiation part 511 to the substrate 2 via the upper stage 506, the template chuck 510 and the template 1 so that an alignment between the template 1 and the substrate 2 is carried out.

Next, as shown in FIG. 6E, after the alignment between the template 1 and the substrate 2 has been completed, an ultraviolet light 7 is irradiated from the irradiation part 511 to the resist material film 4e via the half mirror 513, the upper stage 506, the template chuck 510 and the template 1.

Next, as shown in FIG. 6F, after the resist material film 4e has been cured, when the upper stage 506 is elevated by driving the actuator 508, a resist pattern 4f in which the main pattern part 10 and the like formed in the template 1 are transferred is formed on the film to be processed 3. Subsequently, a process that after the resist pattern 4f is etched back so as to expose a part of the film to be processed 3, an etching is carried out by using the remaining resist pattern as a mask, and the like are passed through so that a desired semiconductor device is obtained.

(Advantages of Third Embodiment)

According to a method of manufacturing a semiconductor device of the third embodiment, the following advantages can be obtained. The amounts of the resist materials to be disposed are varied with two regions on the substrate 2 corresponding to the main pattern part 10 and the mark pattern part 11, so that the unfilled region 112a can be easily formed on the mark pattern part 11, in comparison with a case that the resist materials having an equal amount to each other are disposed on the substrate. The resist material film other than the pattern to become a mask can be equalized in thickness, in comparison with a case that the resist materials having an equal amount to each other are disposed on the substrate and when the resist pattern is etched back so as to expose a part of the film to be processed 3, the pattern is formed only in a part of the film to be processed 3 in which the processing is carried out, so that dimension accuracy of the pattern can be enhanced, and yield rate of the semiconductor device to be manufactured can be enhanced, and further, performance of the semiconductor device to be manufactured can be enhanced. Also, the amount of the resist material to be disposed is varied with regions of the film to be processed, so that consumption of the resist material can be prevented and manufacturing cost of the semiconductor device can be reduced.

[Modifications]

Hereinafter, modifications of a shape of the mark pattern part will be explained.

FIGS. 7A to 7D are cross-sectional views schematically and respectively showing a shape of a mask pattern part according to modifications of the embodiment. Hereinafter, modifications of a cross-section shape of the mark pattern part will be explained.

Figure 7A:
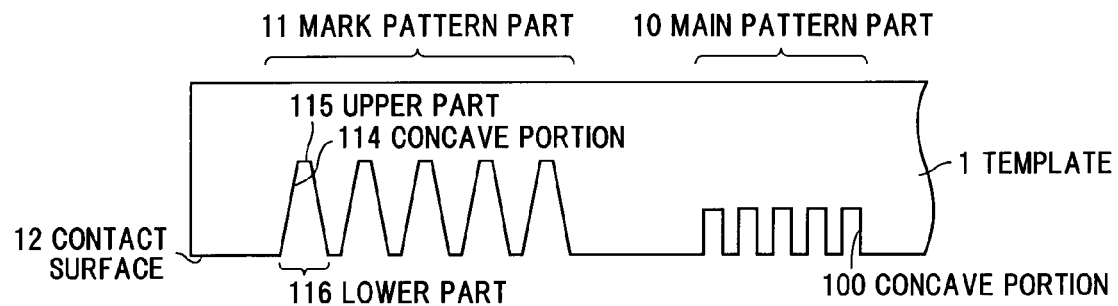
FIGS. 7A to 7D are cross-sectional views schematically and respectively showing a shape of a mark pattern part according to modifications of the embodiment.

The mark pattern part 11 shown in FIG. 7A is formed of, for example, a plurality of the concave portions 114. Each of the concave portions 114 includes an upper part 115 having a first width size in the upper side and a lower part 116 having a second width size larger than the first width size in a side of the contact surface 12. The mark pattern part 11 is less likely to be filled with the resist material than the main pattern part 10, so that when the main pattern part 10 is filled with the resist material, the unfilled region of the resist material is formed in the mark pattern part 11.

Figure 7B:
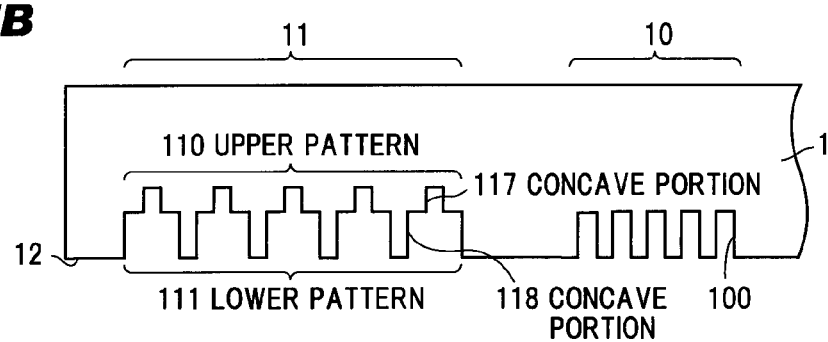

Also, the mark pattern part 11 shown in FIG. 7B, has a shape that, for example, a plurality of concave portions different in shape from each other are incorporated in the direction of the thickness of template 1, and it includes a plurality of concave portions 117 having the first width size and a plurality of concave portions 118 formed so as to sequentially connect to the concave portion 117 and having the second width size larger than the first width size. The mark pattern part 11 is less likely to be filled with the resist material than the main pattern part 10, so that when the main pattern part 10 is filled with the resist material, the unfilled region of the resist material is formed in the mark pattern part 11.

Figure 7C:
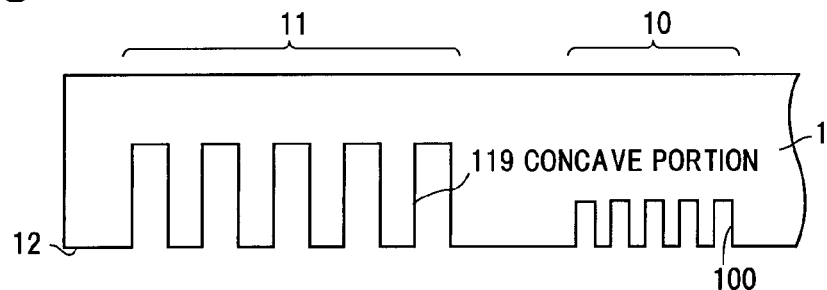

Also, the mark pattern part 11 shown in FIG. 7C, has a shape that, for example, a plurality of concave portions 119 having a width and a depth larger than the concave portions 100 of the main pattern part 10 are formed. The mark pattern part 11 is less likely to be filled with the resist material than the main pattern part 10, so that when the main pattern part 10 is filled with the resist material, the unfilled region of the resist material is formed in the mark pattern part 11.

Figure 7D:
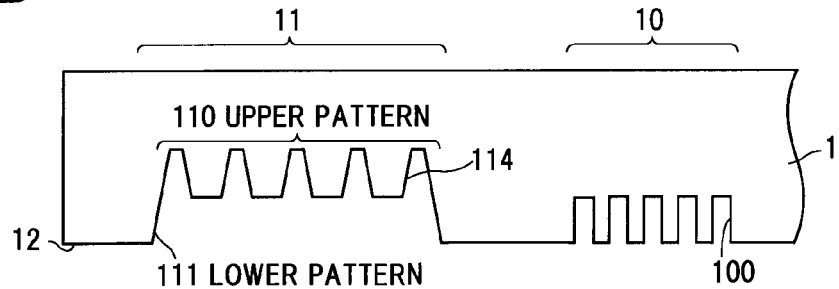

Also, the mark pattern part 11 shown in FIG. 7D, has a shape that, for example, a plurality of concave portions different in shape from each other are incorporated in the direction of the thickness of template 1, and it includes the upper pattern 110 formed due to the concave portions 114 shown in FIG. 7A and the lower pattern 111 formed by the manufacturing method of template in the second embodiment. The mark pattern part 11 includes the concave portions 114 having the first width size in the upper side and the lower pattern 111 having the second width size larger than the first width size in a side of the contact surface 12. The mark pattern part 11 is less likely to be filled with the resist material than the main pattern part 10, so that when the main pattern part 10 is filled with the resist material, the unfilled region of the resist material is formed in the mark pattern part 11.

In any case of the mark pattern parts 11 shown in FIGS. 7A to 7D, when the main pattern part 10 is filled with the resist material, the unfilled region 112a is inevitably formed in the mark pattern part 11, so that the above-mentioned advantages can be obtained. Further, the cross-section shape of the mark pattern part is not limited to the embodiments and modifications, but any shape can be used if it is capable of forming the unfilled region in the mark pattern part when the main pattern part 10 is filled with the resist material.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, the mark pattern part is shown as a pattern that a plurality of lines are disposed at equal intervals in case of seeing it from the side of contact surface, but is not limited to this, a pattern having a circular shape or a rectangular shape can be also used.

What is claimed is:

1. A template formed of an optically transparent material comprising:
   a body;
   a contact surface on the body for contacting a resist material;
   a first concave portion formed on the contact surface for patterning the resist material; and
   a second concave portion formed on the contact surface for forming an alignment mark, the second concave portion comprising:
      an enclosing curved sidewall separating the second concave portion from a periphery of the template, the sidewall extending from the body to a plane of the contact surface; and
      a plurality of cavity elements, the cavity elements comprising:
         openings coplanar with the contact surface; and
         bottom surfaces within the body and parallel to the contact surface, areas of the openings being larger than areas of the bottom surfaces.

2. The template according to claim 1, wherein the plurality of cavity elements comprises:
   first cavity elements having:
      first openings coplanar with the contact surface; and
      first bottom surfaces within the body and parallel to the contact surface; and
   second cavity elements having:
      second openings coplanar with the contact surface; and
      second bottom surfaces within the body and parallel to the contact surface, the second cavity elements being located in the first cavity elements, and the second openings being coplanar with the first bottom surfaces.

3. The template according to claim 1, wherein the second concave portion for alignment mark has a width dimension of the opening larger than the concave portion for resist pattern.

4. The template according to claim 1, wherein the second concave portion for alignment mark has a plurality of concave parts arranged at equal intervals.

5. The template according to claim 1, wherein the second concave portion for alignment mark is formed at the a periphery of the first concave portion for resist pattern.

6. The template according to claim 1, wherein the optically-transparent material is formed of a quartz material.

7. A template formed of an optically transparent material comprising:
   a body;
   a contact surface on the body for contacting a resist material;
   a first concave portion formed on the contact surface for patterning the resist material; and
   a second concave portion formed on the contact surface for forming an alignment mark, the second concave portion comprising an enclosing sidewall separating the second concave portion from a periphery of the template, the sidewall extending from the body to a plane of the contact surfaces, and a plurality of cavity elements, the cavity elements comprising:

a first cavity element comprising a first opening coplanar with the contact surface, and a bottom surface; and second cavity elements located in the first cavity element and comprising:

a plurality of second openings coplanar with each other and with the bottom surface of the first cavity element, and parallel to the contact surface; and a plurality of bottom surfaces in a plane parallel to the contact surfaces, a width of the first opening being greater than a sum of the widths of the second openings.

8. The template according to claim 7, wherein the second concave portion for alignment mark is configured so that a filled region and an unfilled region of the resist material are formed therein when the resist material is filled in the first concave portion for resist pattern.

9. The template according to claim 7, wherein the second concave portion for alignment mark has a shape that a depth thereof is deeper than that of the first concave portion for resist pattern.

10. The template according to claim 7, wherein the second concave portion for alignment mark has a width dimension of the opening larger than that of the first concave portion for resist pattern.

11. The template according to claim 7, wherein the second concave portion for alignment mark has a plurality of concave parts arranged at equal intervals.

12. The template according to claim 7, wherein the second concave portion for alignment mark is formed at a the periphery of the concave portion for resist pattern.

* * * * *